United States Patent
Liu

(10) Patent No.: US 11,428,716 B2
(45) Date of Patent: Aug. 30, 2022

(54) CURRENT DETECTION DEVICE AND MANUFACTURING METHOD THEREOF

(71) Applicant: CYNTEC CO., LTD., Hsin-chu (TW)

(72) Inventor: Po-Wen Liu, Hsin-chu (TW)

(73) Assignee: CYNTEC CO., LTD., Hsin-Chu (TW)

( * ) Notice: Subject to any disclaimer, the term of this patent is extended or adjusted under 35 U.S.C. 154(b) by 0 days.

(21) Appl. No.: 17/070,899

(22) Filed: Oct. 14, 2020

(65) Prior Publication Data

US 2021/0123955 A1 Apr. 29, 2021

Related U.S. Application Data

(60) Provisional application No. 62/926,635, filed on Oct. 28, 2019.

(51) Int. Cl.
*G01R 19/00* (2006.01)
*G01R 1/20* (2006.01)
*G01R 15/14* (2006.01)

(52) U.S. Cl.
CPC ......... *G01R 19/0092* (2013.01); *G01R 1/203* (2013.01); *G01R 15/146* (2013.01)

(58) Field of Classification Search
None
See application file for complete search history.

(56) References Cited

U.S. PATENT DOCUMENTS

| 2018/0172735 A1 | 6/2018 | Arai et al. |
| 2018/0188295 A1* | 7/2018 | Kameko .................. H01C 1/14 |

* cited by examiner

*Primary Examiner* — Jas A Sanghera
(74) *Attorney, Agent, or Firm* — IPR Works LLC

(57) ABSTRACT

A current detection device including two conductors, a resistor and two detection portions is provided. The resistor is disposed between the two conductors. At least one of the detection portions is a detection terminal including a first terminal portion and a second terminal portion. The first terminal portion includes a first flange and a second flange, the second flange is connected to the second terminal portion, and at least one portion of the second flange is buried into at least one conductor. The first flange is buried into the at least one conductor, a distal end of the first flange does not protrude beyond the second surface, a distance is kept between the distal end of the first flange and the second surface, a gap is defined between the first flange and the second flange, and at least one portion of the gap is filled with a material of the at least one conductor.

22 Claims, 13 Drawing Sheets

(a)  (b)

(c)  (d)

CURRENT DETECTION DEVICE AND MANUFACTURING METHOD THEREOF

CROSS-REFERENCE TO RELATED APPLICATIONS

This application claims priority of No. 62/926,635 filed in U.S.A. on Oct. 28, 2019 under 35 USC 119, the entire content of which is hereby incorporated by reference.

BACKGROUND OF THE INVENTION

Field of the Invention

The invention relates to a current detection device and a manufacturing method thereof, and more particularly to a current detection device capable of enhancing processing efficiency and a manufacturing method thereof.

Description of the Related Art

Current detection devices are frequently used in various electronic apparatuses. Usually, the current detection device includes a resistor and one pair of electrodes. The resistor is a plate-like resistor constituted by metal materials and has a low temperature coefficient of resistance. The electrodes constituted by metal materials have the high electroconductivity and are connected to two terminals of the resistor.

According to the prior art, surface welding processes or surface soldering processes are used to manufacture the current detection device. However, this method may cause the displacement of the detection terminal in several welding processes or soldering processes in the high-temperature environment, and cause the change of the resistance value and the loss of the detection precision. In a method, electrodes on two sides of the current detection device are coated with solder, and then connected to a printed circuit board (PCB) by the surface mount technology (SMT). However, the high-temperature operation condition of the welding processes or soldering processes melts the electrode or the solder and changes the resistance in the welding processes or soldering processes several times.

In the current detection technology for vehicle batteries, a shunt current detection method performed using a metal-plate resistor is adopted. For example, U.S. Pat. No. 10,564,188 B2 discloses a current detection device having a voltage detection terminal formed with at least one of a bent portion, an upper flange and a lower flange, and an electrode formed with a through hole, so that the voltage detection terminal passes through the through hole, and then bend at least one of the bent portion, the upper flange and the lower flange to fix the voltage detection terminal onto the electrode. Therefore, a protruding portion for fixing the voltage detection terminal is formed on the surface of the electrode. In order to eliminate the protruding portion, a recess for accommodating the bent portion, the upper flange or the lower flange needs to be additionally formed on the surface of the electrode, and then the protruding portion is squeezed into the recess.

According to the technology of this disclosure, the deformation dimension needs to be reserved on the bottom of the voltage detection terminal, and the condition that the coated layer is damaged upon deformation also needs to be considered. In addition, the prior art has the more complicated manufacturing process, some protruding portions are frequently present due to the tolerance of the manufacturing process, and the connection portion of the base portion of the voltage detection terminal tends to protrude beyond the upper and lower surfaces of the electrode. In addition, the length of the probe portion (i.e., the upper extension length of the voltage detection terminal) is concurrently affected by the tolerance of the manufacturing process and the tolerance of the raw material of the voltage detection terminal, and cannot be effectively controlled within the predetermined dimension.

BRIEF SUMMARY OF THE INVENTION

An objective according to an embodiment of the invention is to provide a current detection device and a manufacturing method thereof to enhance the processing efficiency. An objective in an embodiment is to provide a current detection device and a manufacturing method thereof, wherein, compared with prior art, a protruding length of a second terminal portion protruding beyond a first surface can be controlled more easily.

According to an embodiment of the invention, a current detection device including two conductors, a resistor and two detection portions is provided. At least one conductor includes a first surface and a second surface, and defines a hole extending from the first surface into the inside of the at least one conductor. The resistor is disposed between the two conductors. The two detection portions are respectively disposed on the two conductors, at least one detection portion is a detection terminal including a first terminal portion and a second terminal portion, and at least one portion of the first terminal portion is inserted into the hole. The first terminal portion includes a first flange and a second flange, the second flange is connected to the second terminal portion, and at least one portion of the second flange is buried into the at least one conductor. The first flange is buried into the at least one conductor, a distal end of the first flange does not protrude beyond the second surface, a distance is kept between the distal end of the first flange and the second surface, a gap is defined between the first flange and the second flange, and at least one portion of the gap is filled with a material of the at least one conductor. A width of the second flange is greater than a width of the first flange.

In one embodiment, the width of the first flange is smaller than or equal to a width of the hole, and a width of the second flange is greater than the width of the hole.

In one embodiment, a length of the first terminal portion is smaller than a thickness of the at least one conductor.

In one embodiment, a resistance value or resistivity of the at least one conductor is smaller than a resistance value or resistivity of the resistor.

In one embodiment, the second flange does not protrude beyond the first surface. In one embodiment, the hole does not penetrate through the at least one conductor, and the distal end of the first flange is buried into the at least one conductor. In one embodiment, the distal end of the first flange is not in contact with a bottom of the hole.

In one embodiment, a volume of the second flange protruding beyond the first terminal portion is greater than or equal to a volume of an accommodating space of the gap. Preferably, the volume of the second flange protruding beyond the first terminal portion is greater than or equal to 2.6 times of the volume of the accommodating space of the gap.

In one embodiment, the distal end of the first flange is formed with a chamfer, and a shape of the chamfer is adapted to guiding the first flange into the hole.

In one embodiment, a hardness of the at least one conductor is smaller than a hardness of the detection terminal.

In one embodiment, the hole penetrates through the at least one conductor to expose the distal end of the first flange.

According to an embodiment of the invention, a manufacturing method of a current detection device is provided. The manufacturing method includes steps of: providing two conductors and a resistor; welding the resistor between the two conductors; forming a hole on at least one conductor, which includes a first surface and a second surface, and defines the hole extending from the first surface into the inside of the at least one conductor; providing a detection terminal including a first terminal portion and a second terminal portion, wherein the first terminal portion includes a first flange and a second flange, the second flange is connected to second terminal portion, a gap is defined between the first flange and the second flange, and a width of the second flange is greater than a width of the first flange, the width of the second flange is greater than a width of the hole, and the width of the first flange is smaller than or equal to the width of the hole; and inserting the first terminal portion into the hole to make the first flange be inserted into the hole, and then to make at least one portion of the second flange be buried into the at least one conductor to squeeze the hole and make a material beside the hole be filled into an accommodating space of the gap.

In one embodiment, the manufacturing method of the current detection device further includes a welding step and a cutting step. In the welding step, a welding process is used to weld the resistor to the at least one conductor. The welding process includes at least one of laser beam welding, electron beam welding, and high-current welding (spot welding). In the cutting step, the resistor and the two conductors, which have been welded together, are cut into one or multiple current detection devices having specific shapes.

In one embodiment, a resistance value or resistivity of the at least one conductor is smaller than a resistance value or resistivity of the resistor.

In one embodiment, the step of inserting the first terminal portion into the hole includes steps of: pushing a riveting head against the second flange, wherein the riveting head protrudes beyond one side surface of the second flange; and pushing the first terminal portion into the hole until a portion of the riveting head protruding beyond the side surface of the second flange rests against the first surface of the at least one conductor.

In one embodiment, the step of forming the hole includes the step of forming the hole not to penetrate through the at least one conductor. The depth of the hole is greater than length of the first terminal portion, so that a distance is kept between a distal end of the first flange and the second surface.

In one embodiment, the step of forming a hole on at least one conductor includes: forming the hole so that an aperture of a portion of the hole near the second surface is not greater than an aperture of a portion of the hole near the first surface.

In one embodiment, a volume of the second flange protruding beyond the first terminal portion is greater than or equal to a volume of the accommodating space of the gap. Preferably, in one embodiment, the volume of the second flange protruding beyond the first terminal portion is greater than or equal to 2.6 times of the volume of the accommodating space of the gap.

In summary, according to an embodiment of the present invention, because a distance h1 is kept between the distal end of the first flange and the second surface, the tail end of the detection terminal is not deformed, and the coated layer on the detection terminal cannot be easily damaged. In addition, the distal end of the first flange does not protrude beyond the second surface, so that the second surface of the conductor is kept smooth or flat. In one embodiment, the length of the second terminal portion protruding beyond the first surface can be controlled more easily.

DETAILED DESCRIPTION OF THE INVENTION

Figure 1A:
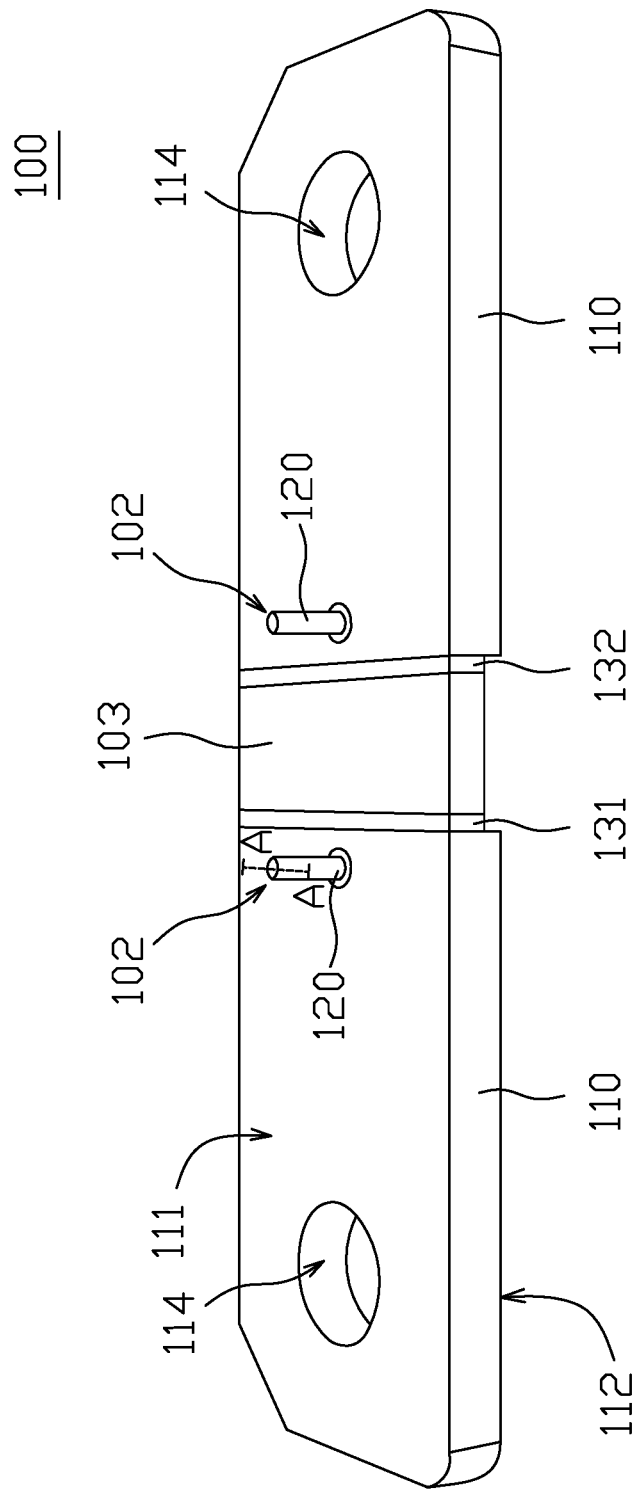
FIG. 1A shows a schematic perspective view of a current detection device of an embodiment of the invention.

In the following, the details will be described with reference to the accompanying drawings. The contents in the accompanying drawings also constitute a part of the detailed description of the specification, and are illustrated in a specific description manner that can implement the embodiment. The following embodiments have described sufficient details to enable those skilled in the art to implement the technology. Of course, other embodiments can also be adopted, or any structural, logical, and electrical modifications can be made without departing from the embodiments described in this disclosure. Therefore, the following detailed description should not be regarded as a limitation.

On the contrary, the embodiments contained therein will be defined by the scope of the claims. The drawings illustrating the various embodiments of the device are not drawn to scale, and in particular, certain dimensions are for clarity of presentation and are shown exaggeratedly in the drawings.

Figure 1B:
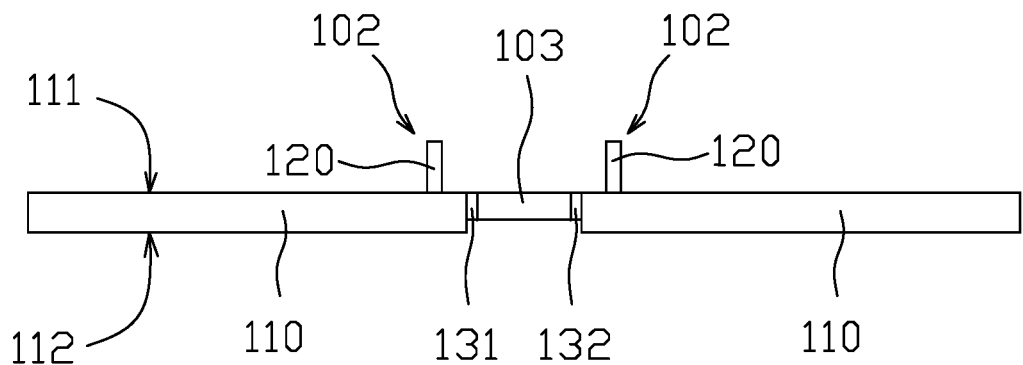
FIG. 1B shows a schematic side view of the current detection device of the embodiment of FIG. 1A.
Figure 1C:
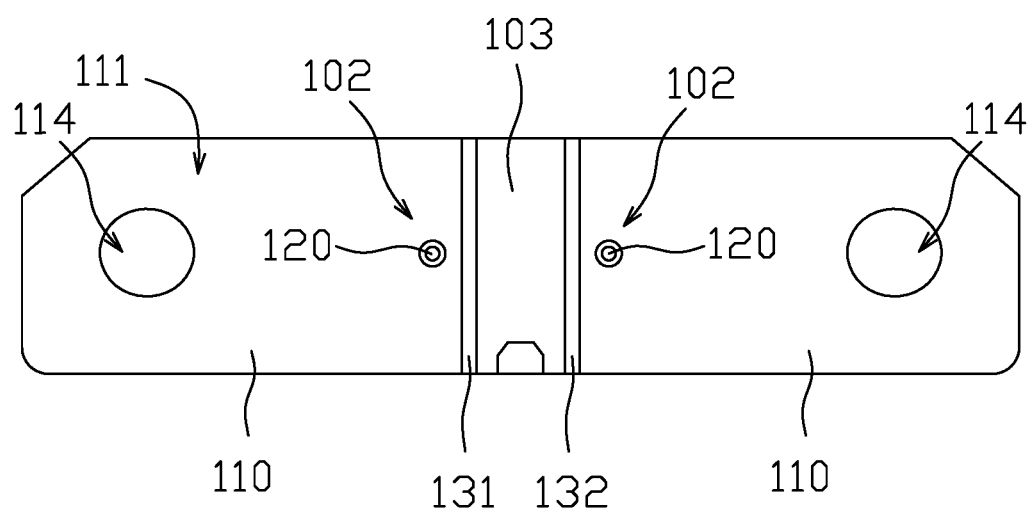
FIG. 1C shows a schematic top view of the current detection device of the embodiment of FIG. 1A.

FIG. 1A shows a schematic perspective view of a current detection device of an embodiment of the invention. FIG. 1B shows a schematic side view of the current detection device of the embodiment of FIG. 1A. FIG. 1C shows a schematic top view of the current detection device of the embodiment of FIG. 1A. Referring to FIGS. 1A to 1C, a current detection device 100 includes two conductors 110, a resistor 103 and two detection portions 102. The resistor 103 is disposed between the two conductors 110. The two detection portions 102 are respectively disposed on the two conductors 110, near two ends of the resistor 103. The current detection device 100 selectively includes two fixing holes 114 respectively disposed on ends of the two conductors 110, so that a fixing member (not shown), such as a screw, may pass through the fixing hole 114 to screw the current detection device 100 onto an electric power system (not shown). When the current detection device 100 is serially connected to a battery path of the electric power system, the to-be-measured current may flow from the end of the conductors 110 to the resistor 103 and flow out of other end of the conductors 110, a corresponding detection voltage is generated between the two detection portions 102, and a current detection unit (not shown) detects a current value of the to-be-measured current, such as 100 amperes, by the detection voltage obtained.

In one embodiment, the welding between the resistor 103 and the two conductors 110 is fusion welding performed by using a welding process and bonding portions 131 and 132 are formed, respectively. The welding process is not particularly restricted, and the welding process may be or include one or more of laser beam welding, electron beam welding, high-current welding (spot welding) and the like.

Figure 2:
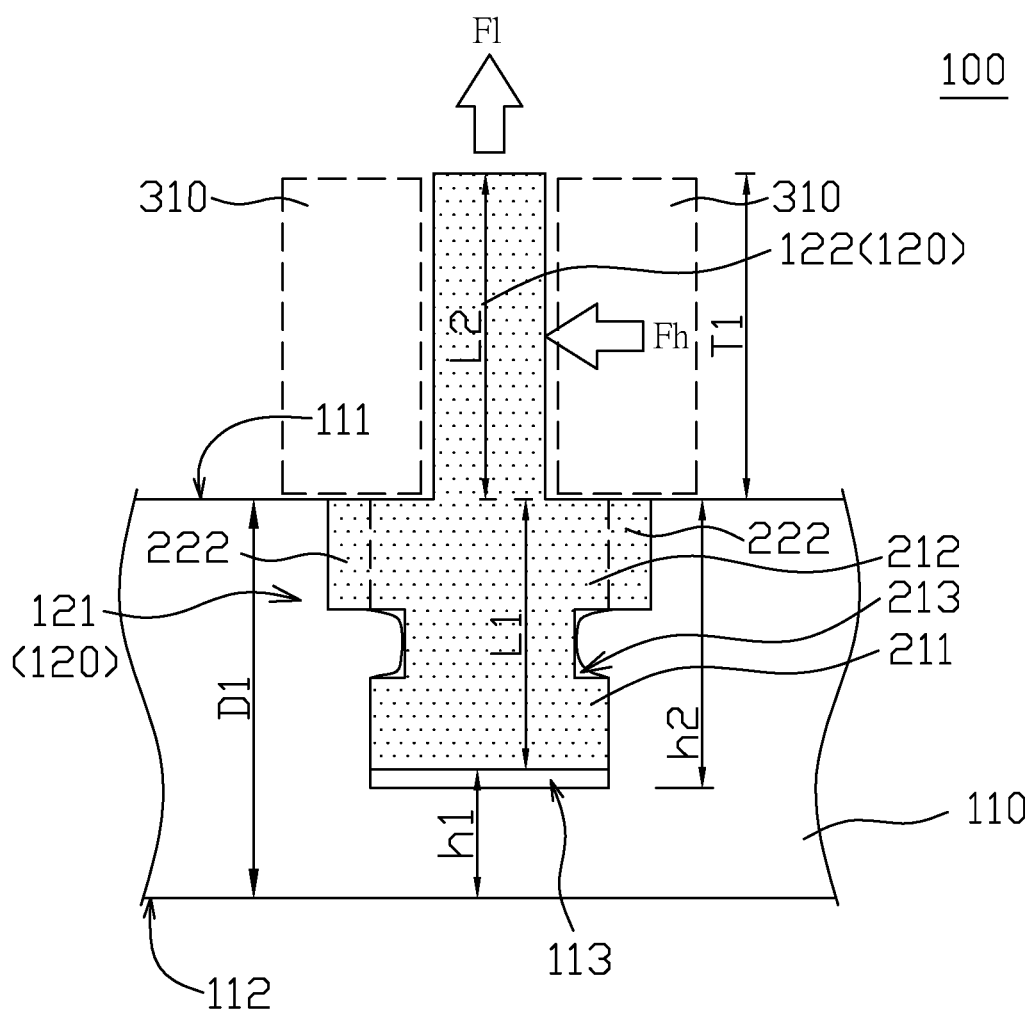
FIG. 2 shows a schematic cross-sectional view along a line A-A of the current detection device of the embodiment of FIG. 1A.

FIG. 2 shows a schematic cross-sectional view along a line A-A of the current detection device of the embodiment of FIG. 1A. As shown in FIGS. 1A and 2, at least one conductor 110 includes a first surface 111 and a second surface 112, and defines a hole 113. The hole 113 extends from the first surface 111 into the inside of the at least one conductor 110. The at least one portion 102 includes a detection terminal 120. The detection terminal 120 includes a first terminal portion 121 and a second terminal portion 122, and at least one portion of the first terminal portion 121 is inserted into the hole 113. The first terminal portion 121 includes a first flange 211 and a second flange 212. The second flange 212 is connected to the second terminal portion 122, and a width W2 of the second flange 212 is greater than a width W1 of the first flange 211. Preferably, the width W2 of the second flange 212 is also greater than a width Wb of the second terminal portion 122. At least one portion of the second flange 212 is buried into the at least one conductor 110. In this embodiment, the second flange 212 may be preferably buried into the at least one conductor 110, and does not protrude beyond the first surface 111.

In one embodiment, a lateral width W1 of the first flange 211 is smaller than or equal to a width Wh of the hole 113, and such the design can make the detection terminal 120 smoothly enter the hole 113, and further make the first flange 211 be buried into the conductors 110. In one embodiment, a lower distal end of the first flange 211 does not protrude beyond the second surface 112, and a distance h1 is kept between the lower distal end of the first flange 211 and the second surface 112. In addition, a gap 213 is defined between the first flange 211 and the second flange 212, and the lateral width W2 of the second flange 212 is greater than the width Wh of the hole 113 to squeeze the conductor 110 to make a material 129 beside the hole 113 of the conductors 110 enter the gap 213, thereby making at least one portion of the gap 213 be filled with the material of the at least one conductor 110.

Figure 4A:
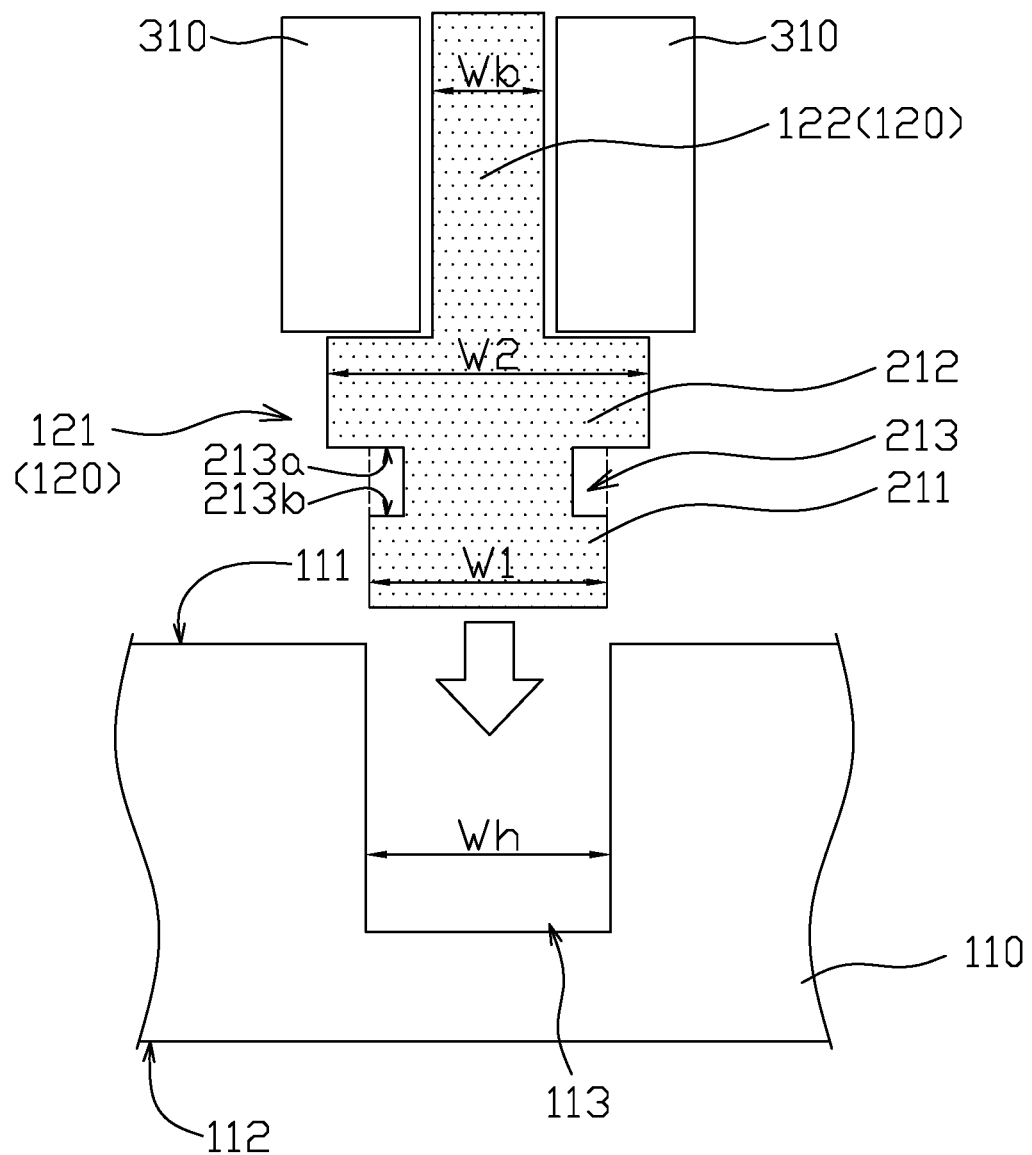
FIG. 4A shows a schematic view of a step of the manufacturing method of the current detection device of the embodiment of the present invention of FIG. 2.
Figure 4B:
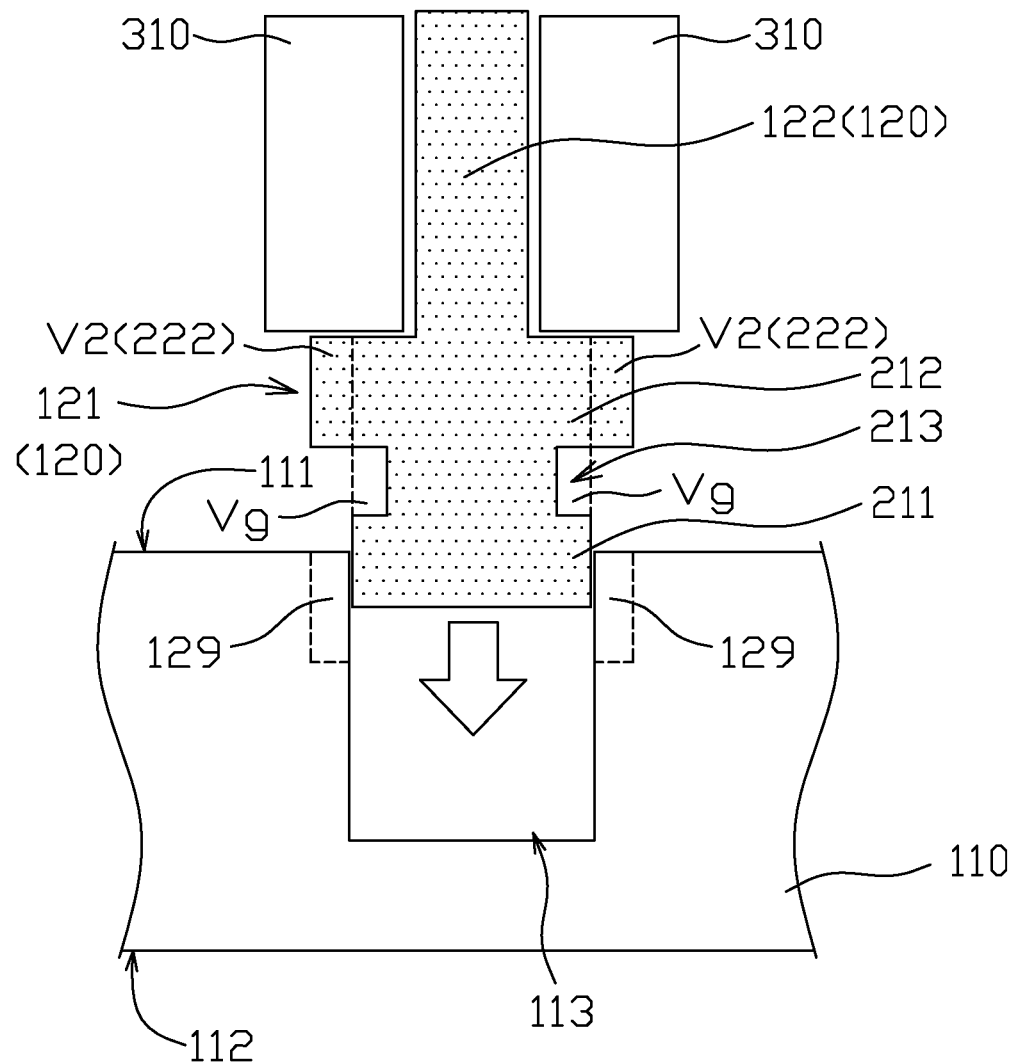
FIG. 4B shows a schematic view of a step of the manufacturing method of the current detection device of the embodiment of the present invention of FIG. 2.

In one embodiment, a volume V2 of a portion 222 of the second flange 212 laterally protruding beyond the first flange 211 (or the inner surface of the hole 113 correspond to the first flange 211) is greater than or equal to a volume Vg of an accommodating space of the gap 213. In one embodiment, the width Wh of the hole 113 is equal to the lateral width W1 of the first flange 211. Preferably, as shown in FIG. 4B, the volume V2 of a portion 222 of the second flange 212 laterally protruding beyond the first terminal flange 211 (or the inner surface of the hole 113 correspond to the first flange 211) is greater than or equal to 2.6 times of the volume Vg of the accommodating space of the gap 213. As shown in FIG. 4A, the volume of the so-called gap 213 is a volume Vg between a top surface 213a of the accommodating space (i.e., the surface extending from the outermost side of the first flange 211 to the second flange 212) and a bottom surface 213b of the accommodating space. In one embodiment, a hardness of the detection terminal 120 is preferably higher than a hardness of the conductor 110. Therefore, the conductors 110 can be squeezed more effectively.

In one embodiment, as shown in FIG. 2, an interval is formed between a distal end of the first flange 211 and a bottom surface of the hole 113. That is, the lower distal end of the first flange 211 is not in contact with the bottom of the hole 113. Alternatively, a depth h2 of the hole 113 is preferably greater than a length L1 of the first terminal portion 121. According to the feature, it is possible to further ensure that the second flange 212 does not protrude beyond the first surface 111, so that a length T1 of the second terminal portion 122 protruding from the first surface 111 (will be described later) can be easily controlled.

In one embodiment, the hole 113 may be a through hole penetrating through the conductors 110 and extending from the first surface 111 to the second surface 112 of the conductors 110. In this embodiment, the lower distal end of the first flange 211 can be exposed from the second surface 112. However, from the viewpoint of keeping flatness of the second surface 112, the hole 113 may be preferably a blind hole. More specifically, the hole 113 does not penetrate through the conductors 110, the lower distal end of the first flange 211 is buried into the hole 113 of the conductors 110, and is not exposed from the second surface 112.

Referring to FIG. 2 again, one single detection terminal of the present invention can endure a side pushing force Fh of more than 200 Newtons. In addition, one single detection terminal can endure a pulling force Fl of more than 400 Newtons. The detection terminal of the invention can avoid or decrease multiple welding processes in the high-temperature environment, so the displacement and resistance change of the detection terminal cannot occur. In addition, in one embodiment, a resistance value or resistivity of the conductor 110 is smaller than a resistance value or resistivity of the resistor 103. Preferably, the resistance value or resistivity of the conductor 110 is smaller than 10 times of the resistance value or resistivity of the resistor 103. The so-called resistivity is a resistance value of a certain substance per unit length and per unit cross-section area. More specifically, the value of the resistivity may be equal to the resistance value of the substance per one meter of length or per one square meter of the transversal cross-section area.

The conductor 110 may be copper, aluminum or an alloy material of a combination thereof, the resistor 103 may be the copper manganese tin alloy, the copper manganese nickel alloy, the nickel chromium aluminum silicon alloy or an alloy material of a combination thereof, and the detection terminal 120 may be the copper, the brass, the phosphor bronze, the metallurgical aluminum, the chromium zirconium copper (CrZrCu), the beryllium copper, the stainless steel or an alloy material of a combination thereof.

Figure 3:
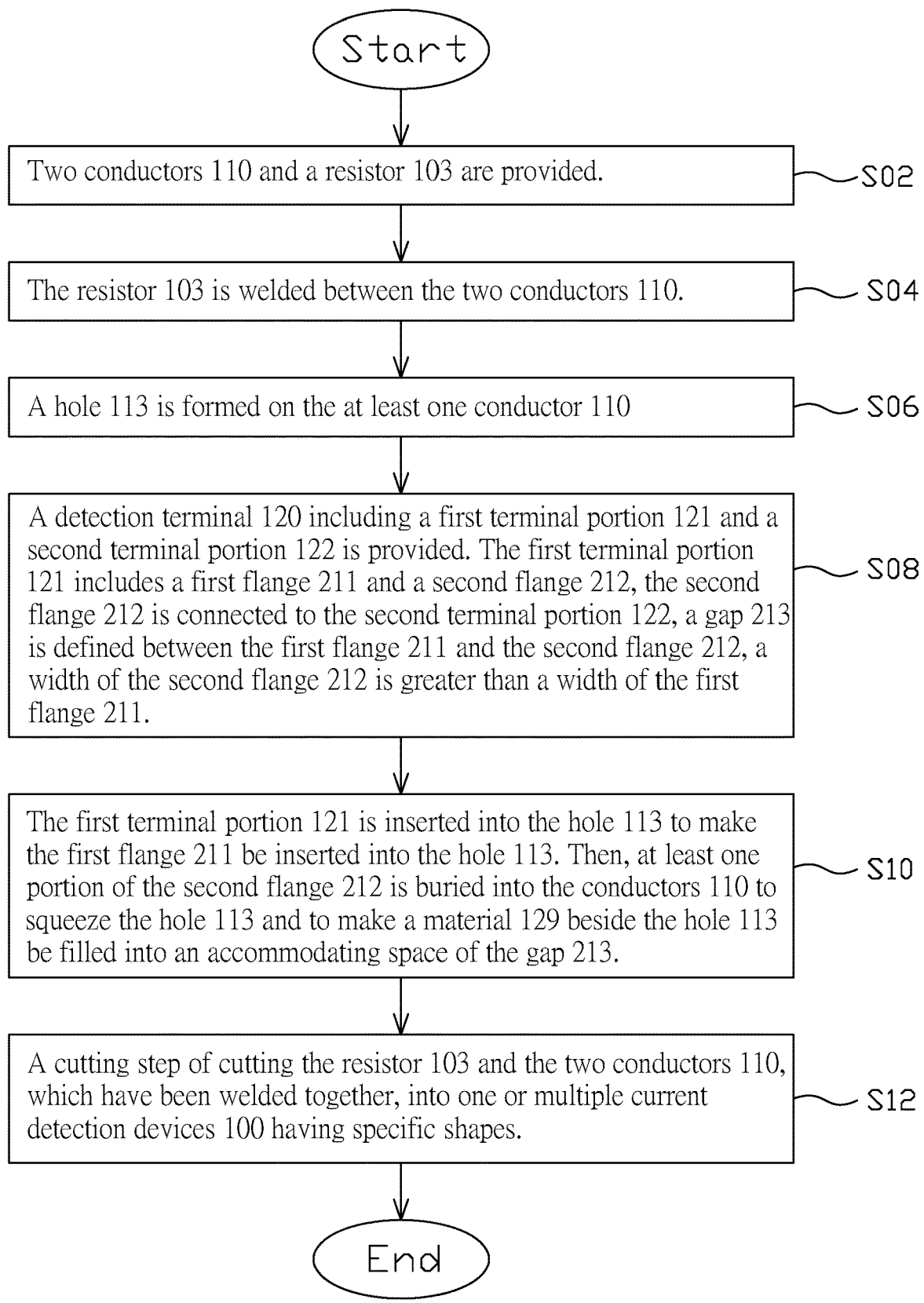
FIG. 3 shows a flow chart of a manufacturing method of a current detection device of an embodiment of the invention.
Figure 4C:
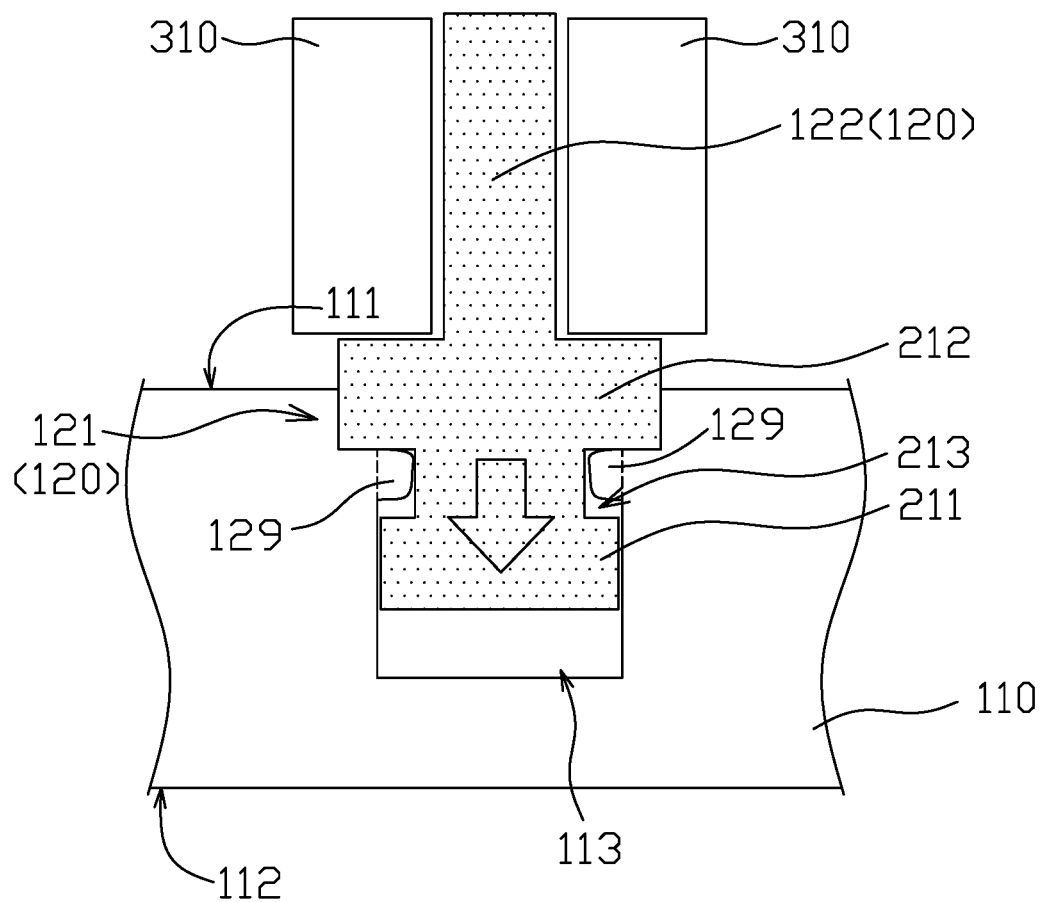
FIG. 4C shows a schematic view of a step of the manufacturing method of the current detection device of the embodiment of the present invention of FIG. 2.

FIG. 3 shows a flow chart of a manufacturing method of a current detection device of an embodiment of the invention. FIG. 4A shows a schematic view of a step of the manufacturing method of the current detection device of the embodiment of the present invention of FIG. 2. FIG. 4B shows a schematic view of a step of the manufacturing method of the current detection device of the embodiment of the present invention of FIG. 2. FIG. 4C shows a schematic view of a step of the manufacturing method of the current detection device of the embodiment of the present invention of FIG. 2.

As shown in FIGS. 3, 4A to 4C, a manufacturing method of the current detection device 100 according to an embodiment of the invention includes the following steps.

In a step S02, two conductors 110 and a resistor 103 are provided.

In a step S04, the resistor 103 is welded between the two conductors 110. The step S04 may include a welding step of fusion welding the resistor to at least one conductor 110 using a welding process, and the welding process includes at least one of laser beam welding, electron beam welding, and high-current welding (spot welding).

In a step S06, a hole 113 is formed on the at least one conductor 110. As shown in FIG. 4A, the at least one conductor 110 includes a first surface 111 and a second surface 112, and the hole 113 extends from the first surface 111 into the inside of the at least one conductor 110. In one embodiment, an aperture of a portion of the hole 113 near the second surface 112 is not greater than an aperture of a portion of the hole 113 near the first surface 111. From the viewpoint of processing convenience, the apertures of portions of the hole 113 are preferably substantially the same. Compared with the above-mentioned prior art, it is unnecessary to additionally consider the external shape of the detection terminal to form the hole, and the requirement on the processing precision of the hole 113 becomes lower.

In a step S08, a detection terminal 120 including a first terminal portion 121 and a second terminal portion 122 is provided. The first terminal portion 121 includes a first flange 211 and a second flange 212, the second flange 212 is connected to the second terminal portion 122, a gap 213 is defined between the first flange 211 and the second flange 212, a width W2 of the second flange 212 is greater than a width W1 of the first flange 211, the width w2 of the second flange 212 is greater than a width Wh of the hole 113, and the width W1 of the first flange 211 is smaller than or equal to the width Wh of the hole 113.

In a step S10, as shown in FIG. 4B, the first terminal portion 121 is inserted into the hole 113 to make the first flange 211 be inserted into the hole 113. Then, as shown in FIG. 4C, at least one portion of the second flange 212 is buried into the conductors 110 to squeeze the hole 113 and to make a material 129 beside the hole 113 be filled into an accommodating space of the gap 213. Preferably, a hardness of the detection terminal 120 is higher than a hardness of the conductor 110. Therefore, the conductors 110 can be squeezed more effectively.

In one embodiment, the width W2 of the second flange 212 is greater than a width Wb of the second terminal portion 122. In the step S10, a riveting head (the head of a riveting hammer) 310 of a riveting machine (not shown) is used to hold the second terminal portion 122 of the detection terminal 120. As shown in FIG. 4A, when the bottom surface of the riveting head 310 is pushed against the upper top surface of the second flange 212, the lateral side of the riveting head 310 protrudes beyond at least one lateral side of the second flange 212. As shown in FIG. 4B, the riveting machine controls the riveting head 310 to move downwards to push the first terminal portion 121 into the hole 113 until a portion of the riveting head 310 protruding beyond the side surface of the second flange 212 rests against the first surface 111 of the at least one of the conductors 110 (as shown in FIG. 2). At this time, a distance h1 is still kept between the lower distal end of the first flange 211 and the second surface 112, and the first flange 211 does not protrude beyond the second surface 112. So, when the riveting head 310 moves downwards, the riveting head 310 does not encounter the excessive resisting force to ensure that the second flange 212 does not protrude beyond the first surface 111. Accordingly, the length T1 of the second terminal portion 122 protruding from the first surface 111 can be easily controlled. In addition, in one embodiment, a depth h2 of the hole 113 is preferably greater than a length L1 of the first terminal portion 121, so that the lower distal end of the first flange 211 does not encounter the resisting force of the conductors 110, and the second flange 212 can enter the conductors 110 more smoothly.

As mentioned hereinabove, when the riveting head 310 rests against the first surface 111 of the conductor 110, the riveting machine encounters a very large resisting force and stops applying of a pressure on the first surface 111. Thus, the depth of the first terminal portion 121 entering the conductor 110 can be controlled by sensing and controlling the pressure from the riveting head 310. Therefore, the height T1 of the second terminal portion 122 of the detection terminal 120 protruding beyond the first surface 111 can also be controlled more easily. According to the prior art, in which the deformation of the bottom end of the detection terminal is required, this embodiment needs not to deform the bottom end of the detection terminal 120. Therefore, the shape of the detection terminal 120 can be roughly maintained, and only one portion of the second flange 212 generates the slight deformation due to the squeeze. Because the deformation of the detection terminal 120 is not needed, the layer coated on the detection terminal 120 is not easily damaged, and the better electrical performance can be obtained. In addition, the pin implantation process and the riveting process are performed in the same direction, and it is unnecessary, as the prior art, to perform the pin implantation on the front side of the electrode and to bend the end of the detection terminal on the backside of the electrode to form the bent portion. Therefore, the processing efficiency of the manufacturing method of this embodiment is higher.

A step S12 is a cutting step of cutting the resistor 103 and the two conductors 110, which have been welded together, into one or multiple current detection devices 100 having specific shapes. Thus, the current detection devices 100 can be manufactured. The cutting step S12 may be performed before the step S04 of mounting the detection terminal 120, and may also be performed after the step S04 of mounting the detection terminal 120. In some embodiments, the cutting step S12 further includes forming a fixing hole 114 on at least one of the conductors 100.

Figure 5A:
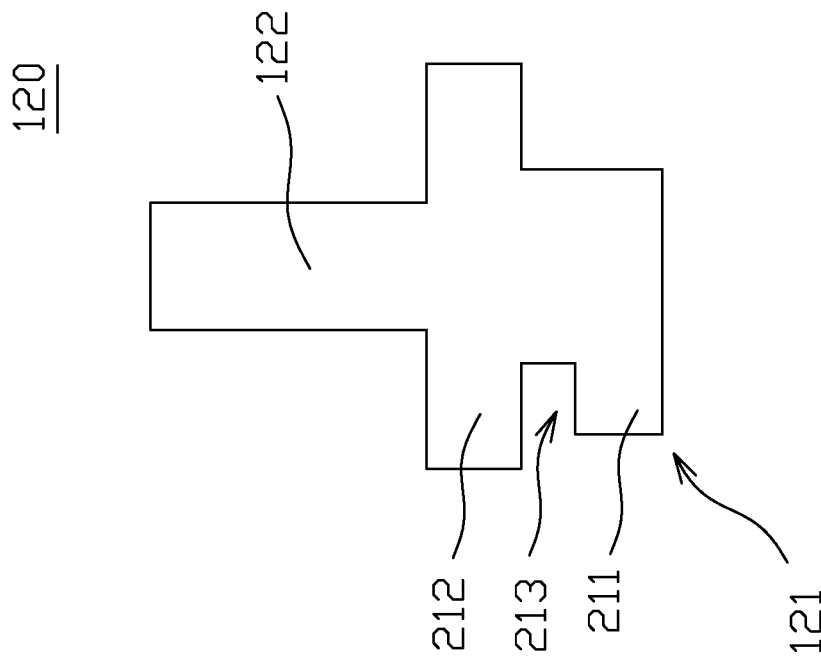
FIG. 5A shows a schematic view of a detection terminal of an embodiment of the present invention.

FIG. 5A shows a schematic view of a detection terminal of an embodiment of the present invention. As shown in FIG. 5A, the lower distal end of the first flange 211 is formed with a chamfer 218 having a shape adapted to guiding of the first flange 211 into the hole 113. Preferably, the lower distal end of the second flange 212 is also formed with a chamfer 219 being an inclined surface and having a shape adapted to guiding the second flange 212 into the conductors 110. In addition, the formation of the chamfer 219 makes the lateral side bottom of the second flange 212 be more evenly stressed, so that the deformation caused by the squeeze cannot be easily generated.

Figure 5B:
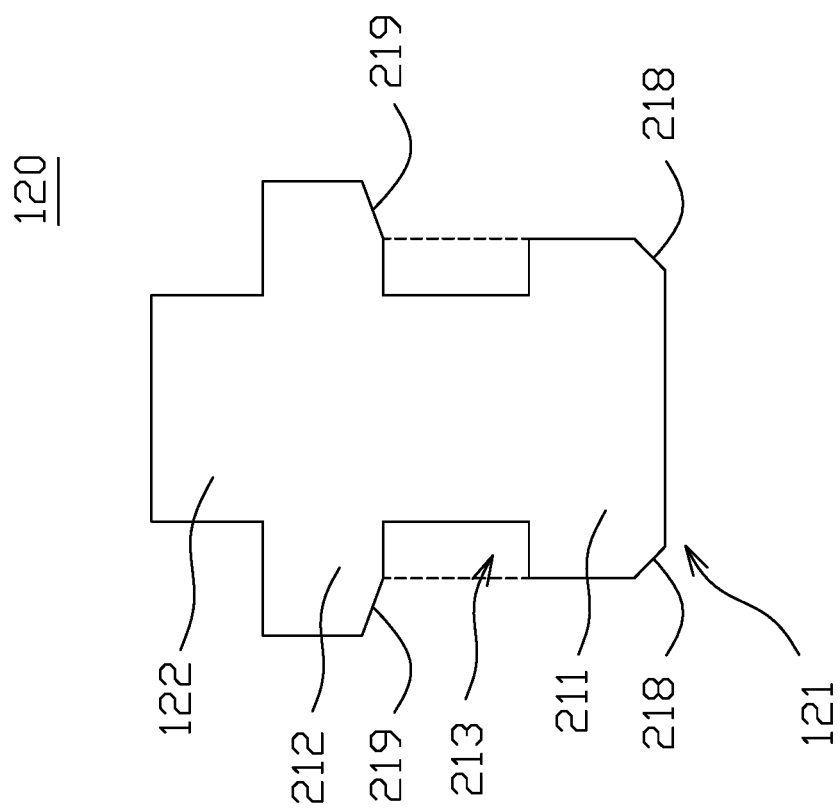
FIG. 5B shows a schematic view of a detection terminal of an embodiment of the present invention.
Figures 5C, 5D:
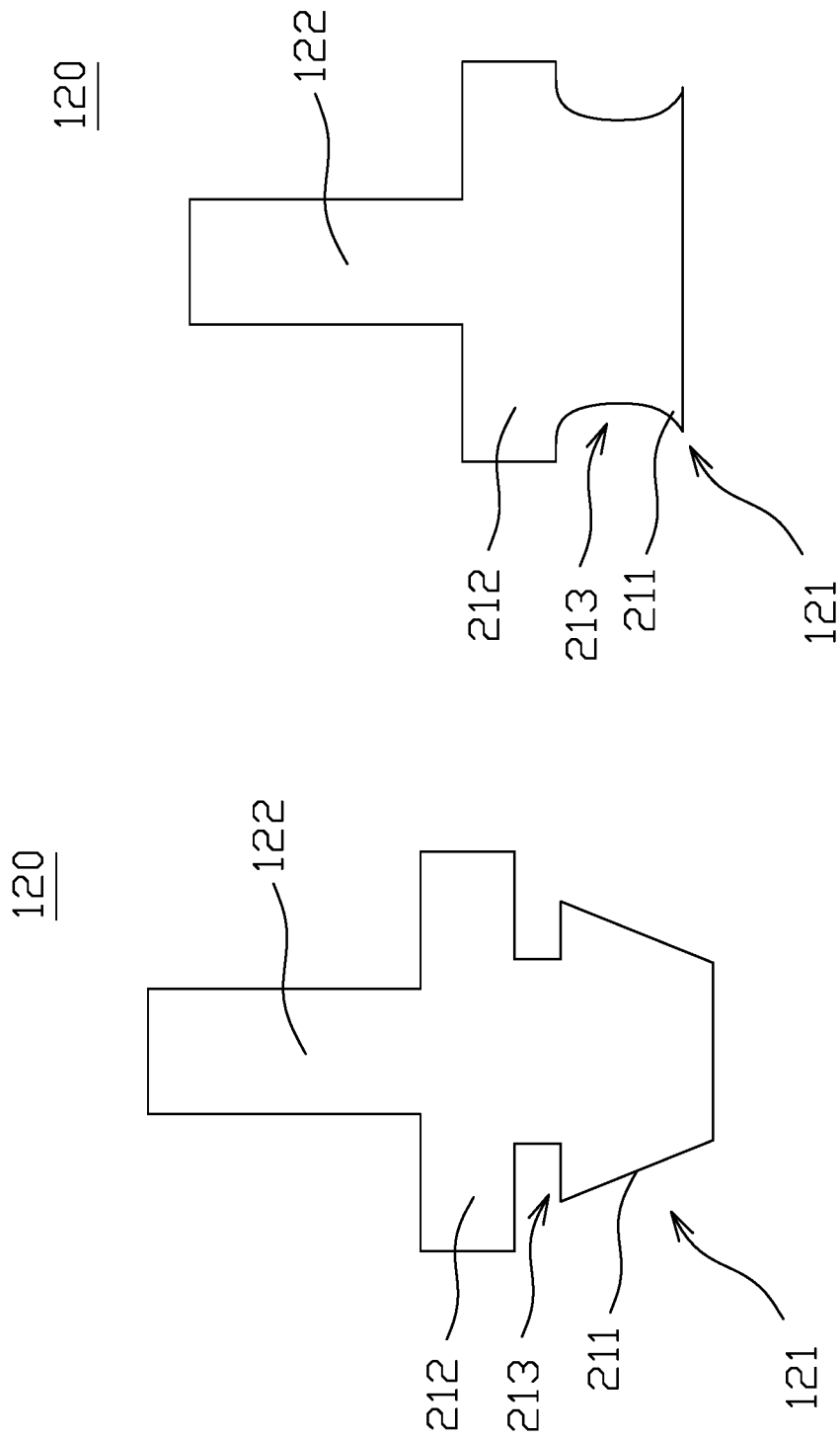
FIG. 5C shows a schematic view of a detection terminal of an embodiment of the present invention.
FIG. 5D shows a schematic view of a detection terminal of an embodiment of the present invention.
Figure 5F:
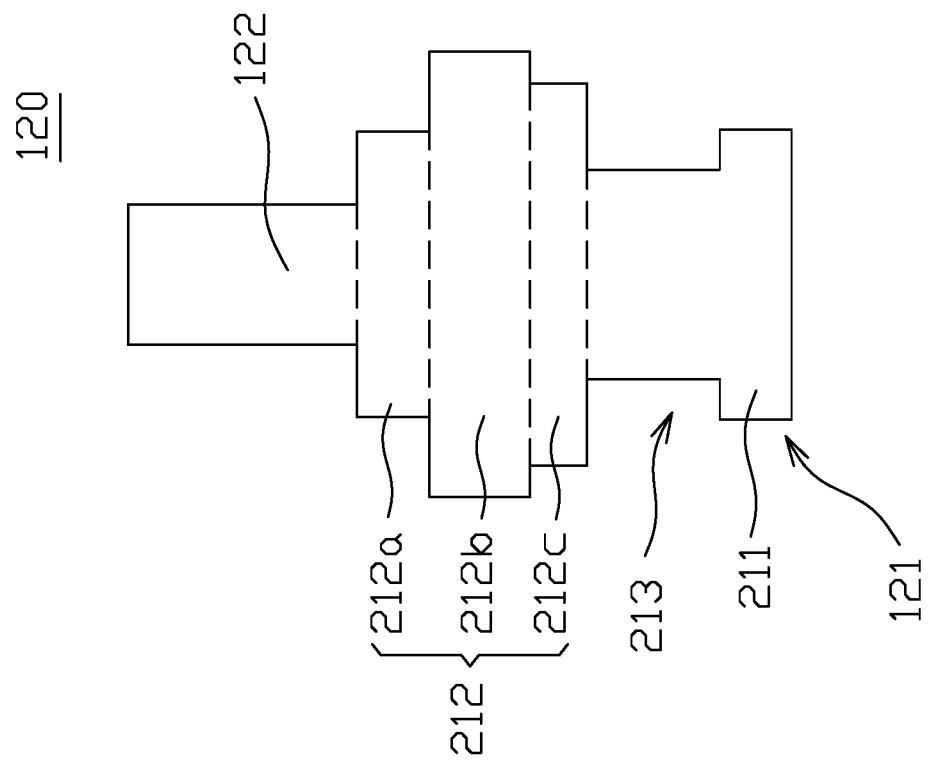
FIG. 5F shows a schematic view of a detection terminal of an embodiment of the present invention.
Figure 5E:
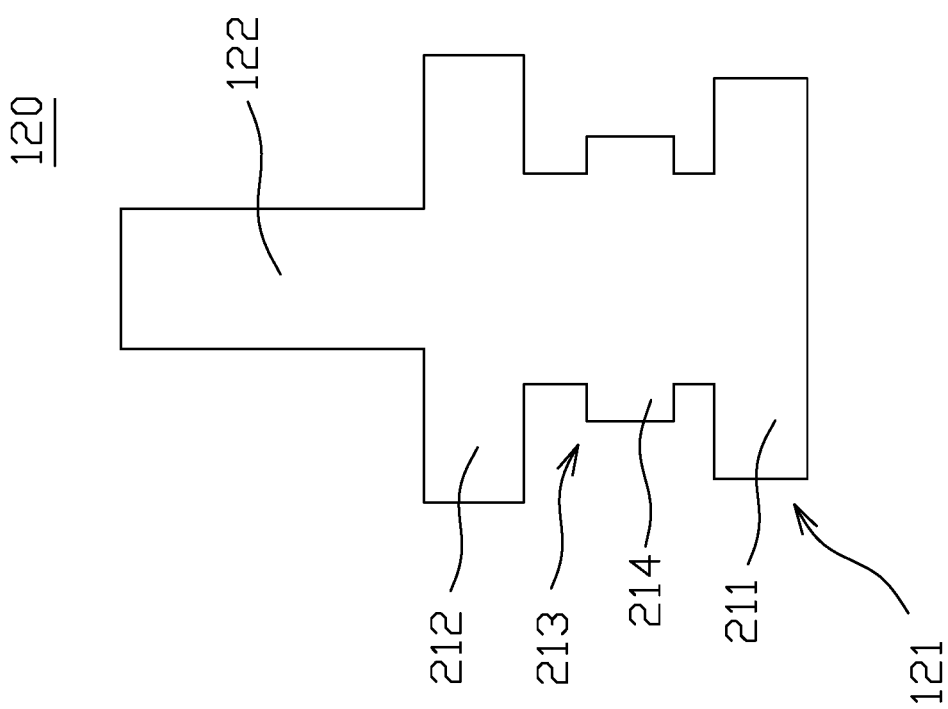
FIG. 5E shows a schematic view of a detection terminal of an embodiment of the present invention.

FIG. 5B shows a schematic view of a detection terminal of an embodiment of the present invention. As shown in FIG. 5B, in one embodiment, the first flange 211 can be disposed only on one side of the detection terminal 120. FIG. 5C shows a schematic view of a detection terminal of an embodiment of the present invention. As shown in FIG. 5C, in one embodiment, the first flange 211 forms a downward trapezoid. FIG. 5D shows a schematic view of a detection terminal of an embodiment of the present invention. As shown in FIG. 5D, in one embodiment, the gap 213 has a curved surface disposed between the first flange 211 and the second flange 212. FIG. 5E shows a schematic view of a detection terminal of an embodiment of the present invention. As shown in FIG. 5E, the first terminal portion 121 further includes a third flange 214. The third flange 214 is disposed between the first flange 211 and the second flange 212, is formed inside the gap 213, and is opposite to the side surface of the second terminal portion 122. The protruding width of the second flange 212 is greater than each of the protruding widths of the first flange 211 and the third flange 214. The protruding width of the first flange 211 is greater than that of the third flange 214. FIG. 5F shows a schematic view of a detection terminal of an embodiment of the present invention. As shown in FIG. 5F, the second flange 212 includes an upper protruding portion 212a, a middle protruding portion 212b and a lower protruding portion 212c. The middle protruding portion 212b is disposed between the upper protruding portion 212a and the lower protruding portion 212c. Compared with the side surface of the second terminal portion 122, the protruding width of the middle protruding portion 212b is greater than each of the protruding widths of the upper protruding portion 212a and the lower protruding portion 212c, and the protruding width of the lower protruding portion 212c is greater than the protruding width of the upper protruding portion 212a. It should be noted that the embodiment of FIGS. 5B to 5F is similar to the embodiment of FIG. 5A. Therefore, the same components are denoted by the same symbols in the above-mentioned explanation, and relevant descriptions thereof are omitted.

Figure 6:
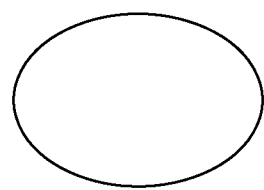
FIG. 6 shows multiple bottom views of multiple first flanges.
Figure 6:
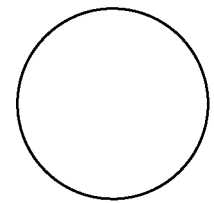
Figure 6:
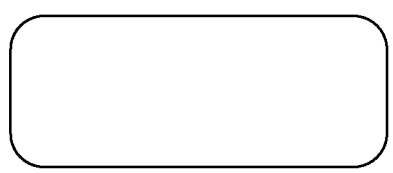
Figure 6:
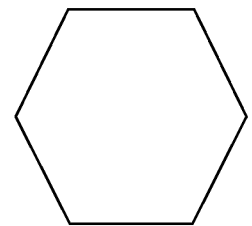

It should be noted that the invention is not restricted to the shape of the first flange 211. FIG. 6 shows multiple bottom views of multiple first flanges 211, and shows the shapes of the bottom surfaces of the first flanges 211 in different embodiments. Referring to FIG. 6, the bottom surface the first flange 211 may have the ellipse shape shown in (a), may have the circular shape shown in (b), may have the rectangular shape shown in (c), may also have the hexagonal shape shown in (d), and may also have other shapes.

According to an embodiment of the invention, a length L1 of the first terminal portion 121 is smaller than a thickness D1 of the conductor 110. Accordingly, the distance h1 between the lower distal end of the first flange 211 and the second surface 112 can be used to absorb the tolerance, and can easily control a length T1 of the second terminal portion 122 protruding from the first surface 111 in the process of squeezing the first terminal portion 121 into the conductor 110 during production. Furthermore, if the tolerance of the raw material is too large (i.e., the length L1 of the first terminal portion 121 is too long), then the distance h1 between the lower distal end of the first flange 211 and the second surface 112 can be used to prevent the lower distal end of the first flange 211 from protruding beyond the second surface 112, or to prevent a distal end of second flange 212 from protruding beyond the first surface 111.

Figure 7A:
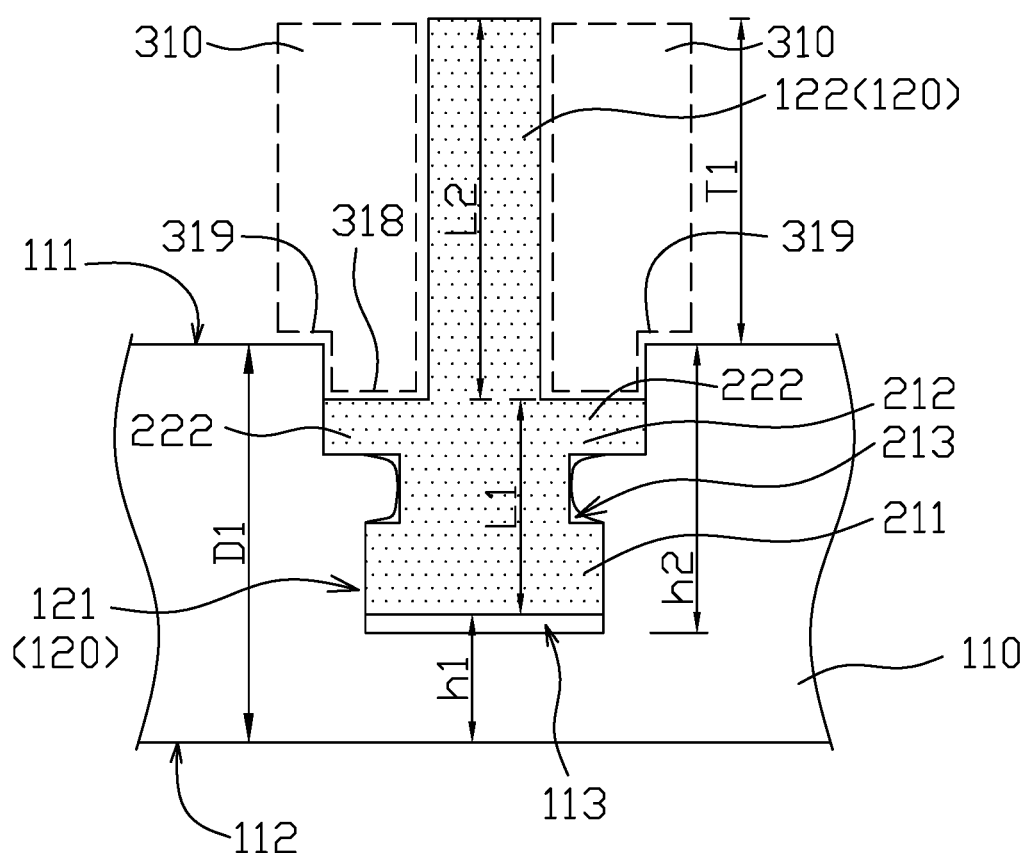
FIG. 7A shows a schematic cross-sectional view along the line A-A of the current detection device of another embodiment of the present invention.
Figure 7B:
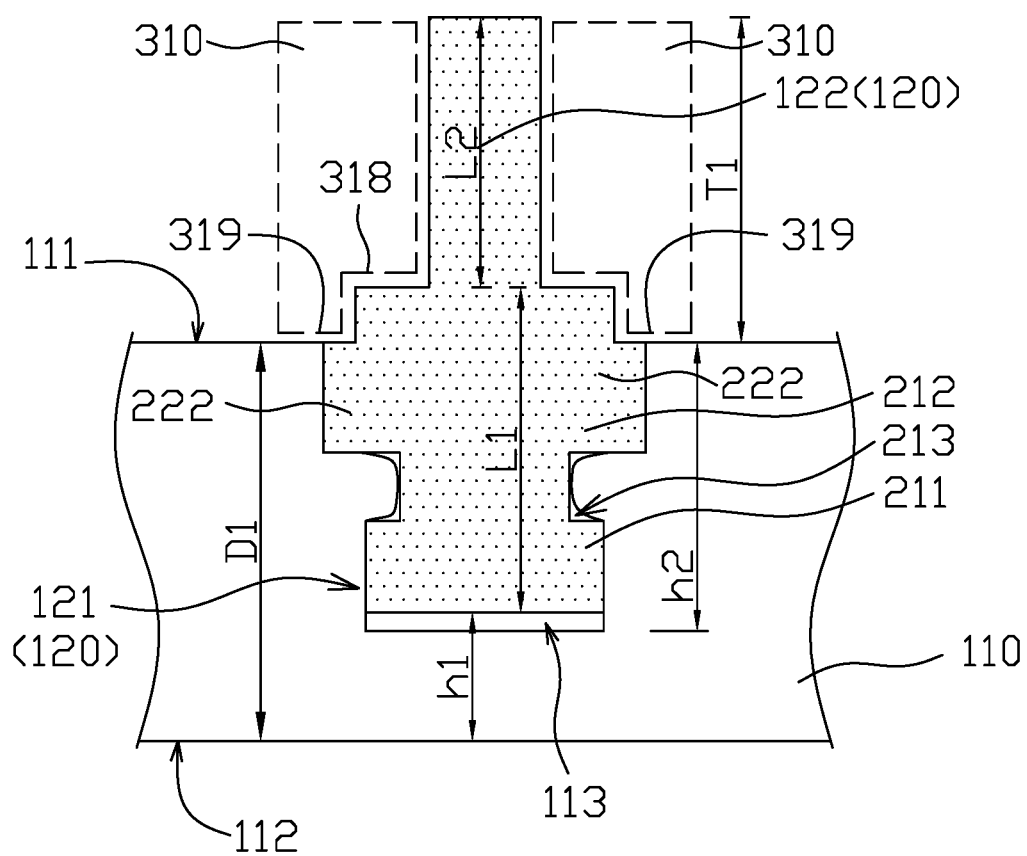
FIG. 7B shows a schematic cross-sectional view along the line A-A of the current detection device of another embodiment of the present invention.

FIG. 7A shows a schematic cross-sectional view along the line A-A of the current detection device of another embodiment of the present invention. As shown in FIG. 7A, the bottom surface of the riveting head 310 in another embodiment is a surface having a step, and includes an inner side surface 318 and an outer side surface 319, the inner side surface 318 is pushed against the upper top surface of the second flange 212, and the outer side surface 319 rests against the first surface 111. In this embodiment, the inner side surface 318 of the bottom surface of the riveting head 310 protrudes beyond the outer side surface 319 of the bottom surface of the riveting head 310. If the tolerance of the raw material is too large (i.e., the length L2 of the second terminal portion 122 is too long), then the inner side surface 318 of the bottom surface of the riveting head 310 can be pushed against the upper top surface of the second flange 212 to make the second flange 212 be selectively squeezed into the conductor 110 (i.e., the upper top surface of the second flange 212 is lower than the first surface 111). As a result, the length T1 of the second terminal portion 122 protruding from the first surface 111 may be adjusted to decrease the deviation of the length T1 (i.e., to satisfy the predetermined specifications). FIG. 7B shows a schematic cross-sectional view along the line A-A of the current detection device of another embodiment of the present invention. The embodiment of FIG. 7B is similar to the embodiment of FIG. 7A. Therefore, the same components are denoted by the same symbols in the above-mentioned explanation, and relevant descriptions thereof are omitted. In addition, as shown in FIG. 7B different from the embodiment of FIG. 7A, the outer side surface 319 of the bottom surface of the riveting head 310 can also protrude beyond the inner side surface 318 of the bottom surface of the riveting head 310 according to the product design.

In summary, because a distance h1 is kept between the lower distal end of the first flange 211 and the second surface 112 according to one embodiment of the invention, it is unnecessary to deform the detection terminal 120 on the side of the second surface 112 to form the flange or bent portion, the coated layer on the detection terminal 120 cannot be easily damaged, and the lifetime of the riveting head 310 is longer. Furthermore, because the thickness of deformation of the detection terminal 120 needs not to be reserved in advance in one embodiment of the invention, the thickness of the conductors 110 can be smaller. For example, when the width of the detection terminal 120 is 1 mm, the minimum thickness of the conductors 110 may be 1.7 mm, and the minimum width of the second flange 212 may be 2 mm. For example, when the width of the detection terminal 120 is 3 mm, the minimum width of the second flange 212 may be 5 mm, and the minimum thickness of the conductors 110 may be 2.0 mm. In addition, the lower distal end of the first flange 211 does not protrude beyond the second surface 112 so that no extra processing procedure is required, and the second surface 112 can be easily kept flat. In one embodiment, the length T1 of the second terminal portion 122 protruding from the first surface 111 can be controlled more easily. One single detection terminal of the present invention can endure a side pushing force Fh of more than 200 Newtons. In addition, one single detection terminal can endure a pulling force Fl of more than 400 Newtons. The detection terminal 120 of the present invention can avoid or decrease multiple welding processes in the high-temperature environment, so the displacement and resistance change of the detection terminal cannot occur.

The foregoing descriptions are only directed to preferred embodiments of the present invention, and all equivalent changes and modifications made in accordance with the claims of the present invention shall be deemed as falling within the scope of the present invention.

What is claimed is:

1. A current detection device, comprising:
   two conductors, wherein at least one conductor comprises a first surface and a second surface and defines a hole extending from the first surface into the inside of the at least one conductor;
   a resistor disposed between the two conductors; and
   two detection portions respectively disposed on the two conductors, wherein at least one detection portion is a detection terminal comprising a first terminal portion and a second terminal portion, and at least one portion of the first terminal portion is inserted into the hole, wherein
   the first terminal portion comprises a first flange and a second flange,
   the second flange is connected to the second terminal portion, and at least one portion of the second flange is buried into the at least one conductor,
   the first flange is buried into the at least one conductor, a distal end of the first flange does not protrude beyond the second surface and keeps a distance from the second surface,
   a gap is defined between the first flange and the second flange, and at least one portion of the gap is filled with a material of the at least one conductor, and
   a width of the second flange is greater than a width of the first flange.

2. The current detection device according to claim 1, wherein the width of the first flange is smaller than or equal to a width of the hole, and the width of the second flange is greater than the width of the hole.

3. The current detection device according to claim 1, wherein a length of the first terminal portion is smaller than a thickness of the at least one conductor.

4. The current detection device according to claim 1, wherein a resistance value or resistivity of the conductor is smaller than a resistance value or resistivity of the resistor.

5. The current detection device according to claim 1, wherein the second flange does not protrude beyond the first surface.

6. The current detection device according to claim 5, wherein the hole does not penetrate through the at least one conductor, and the distal end of the first flange is buried into the at least one conductor.

7. The current detection device according to claim 6, wherein the distal end of the first flange is not in contact with a bottom of the hole.

8. The current detection device according to claim 1, wherein a volume of a portion of the second flange protruding beyond the inner surface of the hole corresponds to the first flange is greater than or equal to a volume of an accommodating space of the gap.

9. The current detection device according to claim 8, wherein the volume of the portion of the second flange protruding beyond the inner surface of the hole corresponds to the first flange is greater than or equal to 2.6 times of the volume of the accommodating space of the gap.

10. The current detection device according to claim 1, wherein the distal end of the first flange is formed with a chamfer, and a shape of the chamfer is adapted to guiding the first flange into the hole.

11. The current detection device according to claim 1, wherein a hardness of the at least one conductor is smaller than a hardness of the detection terminal.

12. The current detection device according to claim 1, wherein the hole penetrates through the at least one conductor to expose the distal end of the first flange.

13. The current detection device according to claim 1, wherein the bottom end of the detection terminal is not deformed.

14. The current detection device according to claim 1, wherein the at least one portion of the gap is filled with the material of the at least one conductor formed by making at least one portion of the second flange be buried into the at least one conductor to squeeze the hole and by making the material beside the hole be filled into the gap.

15. A manufacturing method of a current detection device, comprising steps of:
    providing two conductors and a resistor;
    welding the resistor between the two conductors;
    forming a hole on at least one conductor, wherein the at least one conductor comprises a first surface and a second surface and defines the hole extending from the first surface into the inside of the at least one conductor;
    providing a detection terminal comprising a first terminal portion and a second terminal portion, wherein the first terminal portion comprises a first flange and a second flange, the second flange is connected to the second terminal portion, a gap is defined between the first flange and the second flange, a width of the second flange is greater than a width of the first flange, the width of the second flange is greater than a width of the hole, and the width of the first flange is smaller than or equal to the width of the hole; and
    inserting the first terminal portion into the hole to make the first flange be inserted into the hole, and making the second flange squeeze the at least one conductor so that at least one portion of the second flange is buried into the at least one conductor to make a material beside the hole be filled into an accommodating space of the gap.

16. The manufacturing method according to claim 15, further comprising:
    a welding step of welding the resistor to the at least one conductor using a welding process, wherein the welding process comprises at least one of laser beam welding, electron beam welding and spot welding; and
    a cutting step of cutting the resistor and the two conductors, which have been welded together, into one or multiple current detection devices having specific shapes.

17. The manufacturing method according to claim 15, wherein a resistance value or resistivity of the conductor is smaller than a resistance value or resistivity of the resistor.

18. The manufacturing method according to claim 15, wherein the step of inserting the first terminal portion into the hole comprises:
    pushing a riveting head against the second flange, wherein the riveting head protrudes beyond a side surface of the second flange, and pushing the first terminal portion into the hole until a portion of the riveting head protruding beyond the side surface of the second flange rests against the first surface of the at least one conductor.

19. The manufacturing method according to claim 18, wherein the step of forming the hole comprises forming the hole not to penetrate through the at least one conductor, and a depth of the hole is greater than a length of the first terminal portion, so that a distance is kept between a distal end of the first flange and the second surface.

20. The manufacturing method according to claim 15, wherein the step of forming a hole on at least one conductor comprises:

forming the hole, so that an aperture of a portion of the hole near the second surface is not greater than an aperture of a portion of the hole near the first surface.

21. The manufacturing method according to claim 15, wherein a volume of a portion of the second flange protruding beyond the inner surface of the hole corresponds to the first flange is greater than or equal to a volume of the accommodating space of the gap.

22. The manufacturing method according to claim 21, wherein the volume of the portion of the second flange protruding beyond the inner surface of the hole corresponds to the first flange is greater than or equal to 2.6 times of the volume of the accommodating space of the gap.

* * * * *